(12) United States Patent
Liao et al.

(10) Patent No.: US 8,440,511 B1
(45) Date of Patent: May 14, 2013

(54) METHOD FOR MANUFACTURING MULTI-GATE TRANSISTOR DEVICE

(75) Inventors: Chin-I Liao, Tainan (TW); Chia-Lin Hsu, Tainan (TW); Ming-Yen Li, Taichung (TW); Min-Ying Hsu, Tainan (TW); Hsin-Huei Wu, Chiayi (TW); Yung-Lun Hsieh, Tainan (TW); Chien-Hao Chen, Yun-Lin County (TW); Bo-Syuan Lee, Tainan (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 13/298,264

(22) Filed: Nov. 16, 2011

(51) Int. Cl.
*H01L 21/00* (2006.01)

(52) U.S. Cl.
USPC ............................................. 438/157

(58) Field of Classification Search ............. 438/157, 438/283
See application file for complete search history.

(56) References Cited

U.S. PATENT DOCUMENTS

| | | | |
|---|---|---|---|
| 5,498,768 A | 3/1996 | Nishitani |
| 6,043,138 A | 3/2000 | Ibok |
| 6,063,698 A | 5/2000 | Tseng |
| 6,251,761 B1 | 6/2001 | Rodder |
| 6,380,104 B1 | 4/2002 | Yu |
| 6,492,216 B1 | 12/2002 | Yeo |
| 6,492,217 B1 | 12/2002 | Bai |
| 6,642,066 B1 | 11/2003 | Halliyal |
| 6,656,852 B2 | 12/2003 | Rotondaro |
| 6,696,345 B2 | 2/2004 | Chau |
| 6,818,517 B1 | 11/2004 | Maes |
| 6,818,553 B1 | 11/2004 | Yu |
| 6,841,484 B2 | 1/2005 | Ying |
| 6,921,711 B2 | 7/2005 | Cabral, Jr. |
| 6,921,963 B2 | 7/2005 | Krivokapic |
| 7,012,027 B2 | 3/2006 | Perng |
| 7,030,430 B2 | 4/2006 | Doczy |
| 7,087,477 B2 | 8/2006 | Fried |
| 7,091,551 B1 | 8/2006 | Anderson |
| 7,126,199 B2 | 10/2006 | Doczy |
| 7,135,361 B2 | 11/2006 | Visokay |
| 7,157,378 B2 | 1/2007 | Brask |
| 7,160,767 B2 | 1/2007 | Brask |
| 7,208,366 B2 | 4/2007 | Tsai |
| 7,247,887 B2 | 7/2007 | King |
| 7,250,658 B2 | 7/2007 | Doris |
| 7,309,626 B2 | 12/2007 | Ieong |
| 7,352,034 B2 | 4/2008 | Booth, Jr. |
| 7,371,649 B2 | 5/2008 | Cheng |
| 7,381,608 B2 | 6/2008 | Brask |
| 7,384,880 B2 | 6/2008 | Brask |
| 7,396,777 B2 | 7/2008 | Jung et al. |
| 7,470,570 B2 | 12/2008 | Beintner |
| 7,488,656 B2 | 2/2009 | Cartier |
| 7,501,336 B2 | 3/2009 | Doyle |
| 7,521,324 B2 | 4/2009 | Ohmi |
| 7,531,437 B2 | 5/2009 | Brask |
| 7,569,857 B2 | 8/2009 | Simon et al. |

(Continued)

*Primary Examiner* — Bradley K Smith
(74) *Attorney, Agent, or Firm* — Winston Hsu; Scott Margo

(57) ABSTRACT

A method for manufacturing multi-gate transistor device includes providing a semiconductor substrate having a patterned semiconductor layer and a patterned hard mask sequentially formed thereon, removing the patterned hard mask, performing a thermal treatment to rounding the patterned semiconductor layer with a process temperature lower than 800° C., and sequentially forming a gate dielectric layer and a gate layer covering a portion of the patterned semiconductor layer on the semiconductor substrate.

11 Claims, 3 Drawing Sheets

U.S. PATENT DOCUMENTS

| | | |
|---|---|---|
| 7,601,648 B2 | 10/2009 | Chua |
| 7,824,990 B2 | 11/2010 | Chang |
| 2004/0007561 A1 | 1/2004 | Nallan |
| 2004/0195624 A1 | 10/2004 | Liu |
| 2005/0051825 A1 | 3/2005 | Fujiwara |
| 2005/0202624 A1 | 9/2005 | Li |
| 2005/0275035 A1 | 12/2005 | Mathew |
| 2006/0054943 A1 | 3/2006 | Li |
| 2006/0094192 A1 | 5/2006 | Yang |
| 2006/0099830 A1 | 5/2006 | Walther |
| 2006/0172548 A1 | 8/2006 | Wu |
| 2006/0211259 A1 | 9/2006 | Maes |
| 2006/0284271 A1 | 12/2006 | Doyle |
| 2006/0286729 A1 | 12/2006 | Kavalieros |
| 2007/0108528 A1 | 5/2007 | Anderson |
| 2007/0158756 A1 | 7/2007 | Dreeskornfeld |
| 2008/0070395 A1 | 3/2008 | Yen |
| 2008/0157208 A1 | 7/2008 | Fischer |
| 2008/0157231 A1 | 7/2008 | Wang |
| 2009/0057787 A1 | 3/2009 | Matsuki |
| 2009/0124097 A1 | 5/2009 | Cheng |
| 2009/0179283 A1 | 7/2009 | Adams |
| 2009/0242964 A1* | 10/2009 | Akil et al. ............. 257/324 |
| 2009/0269916 A1* | 10/2009 | Kang et al. ............. 438/587 |
| 2010/0048027 A1 | 2/2010 | Cheng |
| 2010/0062592 A1 | 3/2010 | Clark |
| 2010/0068877 A1 | 3/2010 | Yeh |
| 2010/0072553 A1 | 3/2010 | Xu |
| 2010/0075507 A1 | 3/2010 | Chang |
| 2010/0081262 A1 | 4/2010 | Lim |
| 2010/0144121 A1 | 6/2010 | Chang |
| 2010/0167506 A1 | 7/2010 | Lin |
| 2010/0184281 A1 | 7/2010 | Hsu |
| 2010/0219481 A1 | 9/2010 | Tseng |

* cited by examiner

METHOD FOR MANUFACTURING MULTI-GATE TRANSISTOR DEVICE

BACKGROUND OF THE INVENTION

1. Field of the Invention

The invention relates to a method for manufacturing a multi-gate transistor device.

2. Description of the Prior Art

Conventional planar metal-oxide-semiconductor (MOS) transistor has difficulty when scaling down to 65 nm and below. Therefore the non-planar transistor technology such as Fin Field effect transistor (FinFET) technology that allows smaller size and higher performance is developed to replace the planar MOS transistor.

Please refer to FIG. 1, which is a schematic drawing of a conventional FinFET device. As shown in FIG. 1, the conventional FinFET device 100 is formed by: first a single crystalline silicon layer of a silicon-on-insulator (SOI) substrate 102 is patterned to form a fin film (not shown) in the SOI substrate 102 by proper etching process. Then, a high dielectric constant (high-k) insulating layer 104 covering the fin film is formed and followed by forming a gate 106 covering the high-k insulating layer 104 and the fin film. Next, ion implantation and anneal treatment are performed to form a source/drain 108 in the fin film not covered by the gate 106. Since the manufacturing processes of the FinFET device 100 are easily integrated into the traditional logic device processes, it provides superior process compatibility. Furthermore, due to the structural particularity of its three-dimensional structure, traditional shallow trench isolation (STI) is not required in FinFET technology. More important, since the FinFET device 100 increases the overlapping area between the gate and the substrate, the channel region is more effectively controlled. This therefore reduces drain-induced barrier lowering (DIBL) effect and short channel effect. In addition, the channel region is longer under the same gate length, and thus the current between the source and the drain is increased.

However, the FinFET device 100 still faces many problems. For example, the electrical performance of the FinFET device 100 is seriously impacted by the surface roughness of the source/drain 108 while the FinFET device 100 always suffers corner leakage at the fin. Therefore, it is still in need to develop a method for manufacturing multi-gate transistor device that is able to solve the above mentioned problems.

SUMMARY OF THE INVENTION

According to an aspect of the present invention, a method for manufacturing multi-gate transistor device is provided. The method includes providing a semiconductor substrate having a patterned semiconductor layer and a patterned hard mask sequentially formed thereon, removing the patterned hard mask, performing a thermal treatment to rounding the patterned semiconductor layer with a process temperature lower than 800° C., and sequentially forming a gate dielectric layer and a gate layer covering a portion of the patterned semiconductor layer on the semiconductor substrate.

According to the method for manufacturing a multi-gate transistor device provided by the present invention, the corners of the patterned semiconductor layer are rounded by performing the thermal treatment with the process temperature lower than 800° C., that fulfills the low thermal budget requirement of FinFET process. Consequently, corner leakage is prevented. In the same time, surface roughness of the patterned semiconductor layer is improved by the thermal treatment, and thus the formation result of the gate dielectric layer and the gate layer, which are formed on the patterned semiconductor layer, is improved. Consequently the method for manufacturing multi-gate transistor device improves electric performance of the obtained multi-gate transistor device.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 2-5 are schematic drawings illustrating a method for manufacturing a multi-gate transistor device provided by a first preferred embodiment of the present invention, wherein FIG. 3 is a schematic drawing in a step subsequent to FIG. 2, FIG. 4 is a schematic drawing in a step subsequent to FIG. 3, and FIG. 5 is a schematic drawing in a step subsequent to FIG. 4.

DETAILED DESCRIPTION

Figure 1:
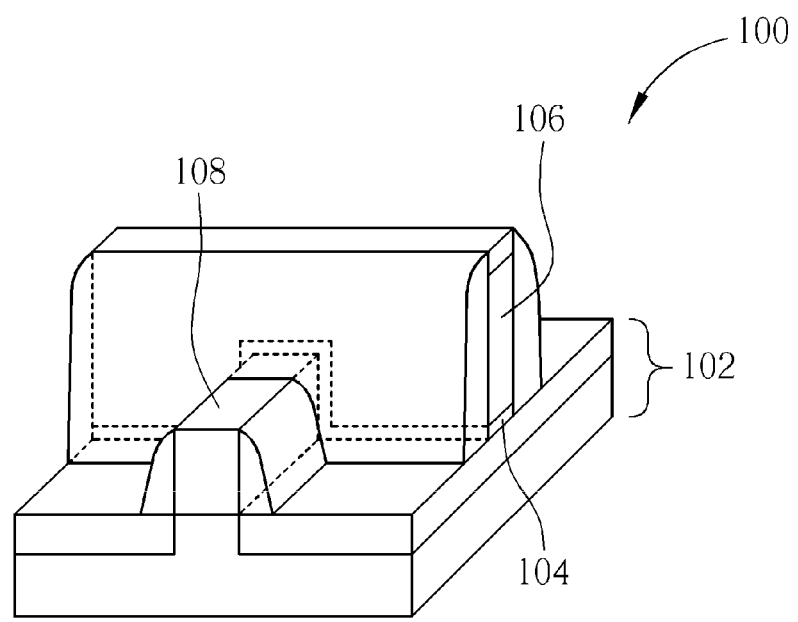
FIG. 1 is a schematic drawing of a conventional FinFET device.
Figure 2:
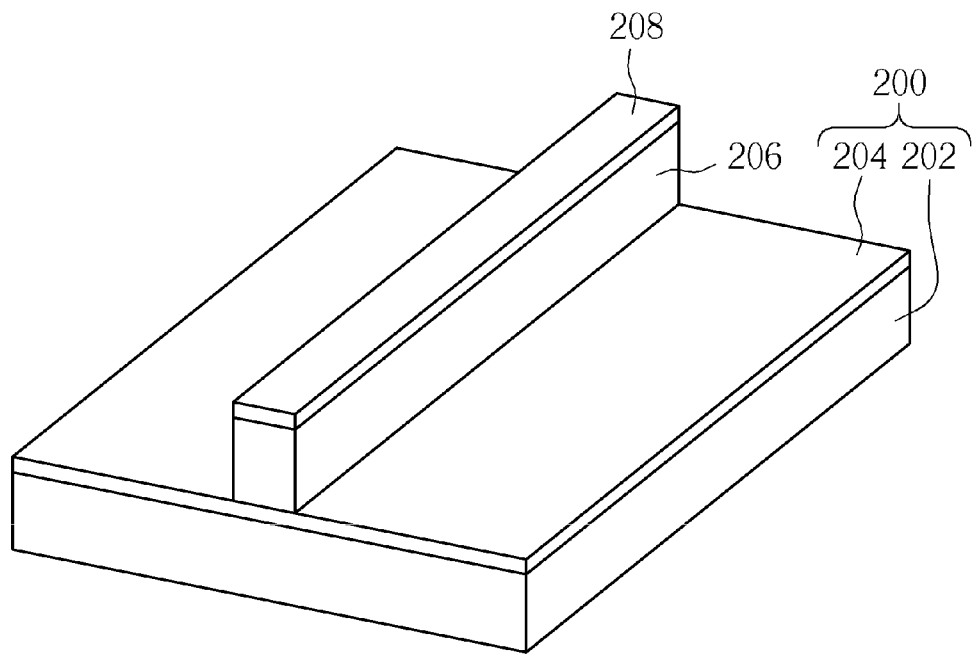

Please refer to FIGS. 2-5, which are schematic drawings illustrating a method for manufacturing a multi-gate transistor device provided by a first preferred embodiment of the present invention. As shown in FIG. 2, the preferred embodiment first provides a semiconductor substrate 200. The semiconductor substrate 200 can include a silicon-on-insulator (SOI) substrate. It is well-known to those skilled in the art that the SOI substrate upwardly includes a silicon substrate 202, a bottom oxide (BOX) layer 204, and a semiconductor layer (not shown) such as a single crystalline silicon layer formed on the BOX layer 204. However, for providing superior ground connection and thermal dissipation and for reducing interference and cost, the semiconductor substrate 200 provided by the preferred embodiment also can include a bulk silicon substrate.

Please still refer to FIG. 2. Next, a patterned hard mask 208 for defining at least a fin of a multi-gate transistor device is formed on the semiconductor substrate 200 and followed by performing an etching process. Thus a portion of the semiconductor material of the semiconductor substrate 200 is removed to form at least a patterned semiconductor layer 206 on the semiconductor substrate 200. The patterned semiconductor layer 206 comprises at least a fin of a multi-gate transistor device as shown in FIG. 2. The patterned semiconductor layer 206 includes a width and a height, and a ratio between the width and the height is about 1:1.5-1:2, but not limited to this.

Figure 3:
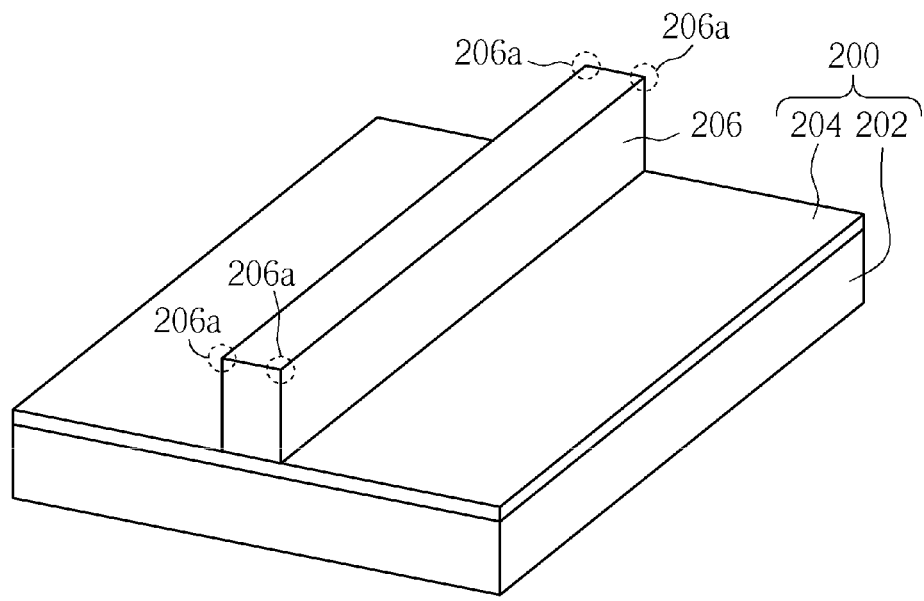

Please refer to FIG. 3. After forming the patterned semiconductor layer 206, the patterned hard mask 208 is removed to expose the patterned semiconductor layer 206. As shown in FIG. 3, the patterned semiconductor layer 206 is a slim structure having rectangular cross-section view. Therefore, the corners of the patterned semiconductor layer 206, which are emphasized by Circle 206a in FIG. 3, are all sharp corners. And thus corner leakage is always found at those sharp corners.

Figure 4:
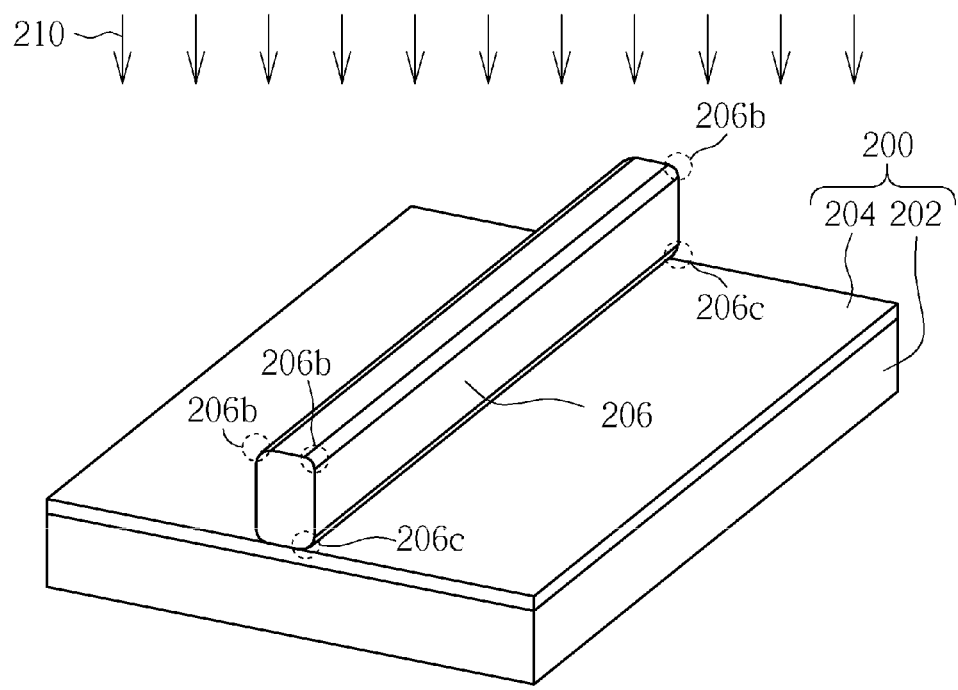

Please refer to FIG. 4. Next, a thermal treatment 210 is performed to rounding the patterned semiconductor layer 206. In detail, the thermal treatment 210 includes a step of introducing hydrogen, and a gas flow rate of $H_2$ is between 10 standard liter per minute (slm) and 15 slm. The thermal treatment 210 includes a process pressure, and the process pressure is lower than 1 Torr. The thermal treatment 210 also includes a process temperature lower than 800° C., preferably lower than 740° C. The thermal treatment 210 further includes a process duration and the process duration is less than 2 minutes. Because the corners atop the patterned semiconductor layer 206, even the corners adjacent to the BOX layer 204, have higher free energy, silicon materials in the corners easily react with hydrogen and thus are removed from the patterned semiconductor layer 206. Accordingly, the thermal treatment 210 with introduced hydrogen is able to rounding the patterned semiconductor layer 206 under a lower thermal budget and in a shorter process duration. As shown in FIG. 4, the patterned semiconductor layer 206 consequently obtains arc and smooth corners as emphasized by Circle 206b and Circle 206c in FIG. 4.

Figure 5:
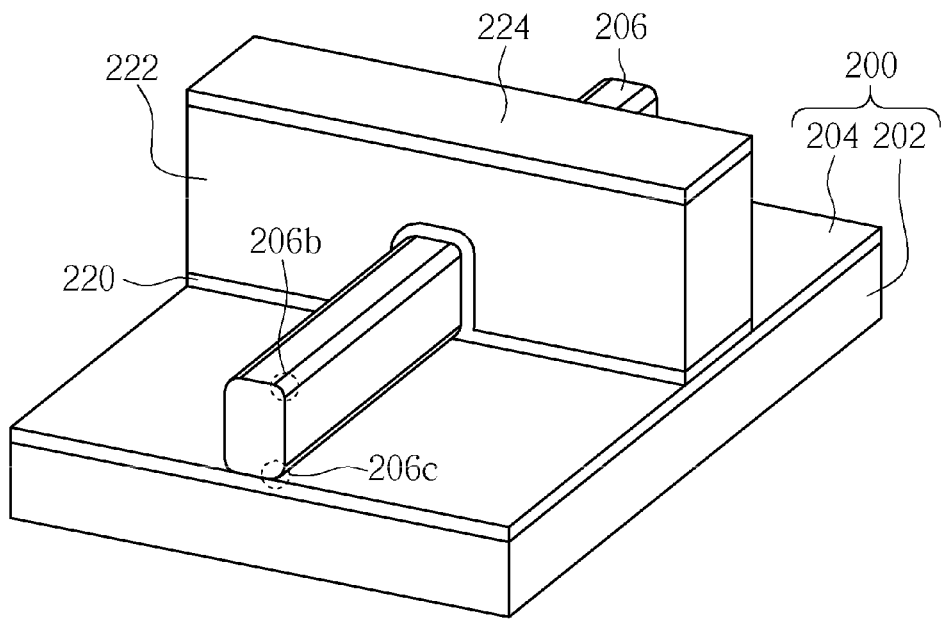

Please refer to FIG. 5. Subsequently, a dielectric layer (not shown), a gate forming layer (not shown) and a patterned hard mask 224 are sequentially formed on the semiconductor substrate 200 and followed by patterning the dielectric layer and the gate forming layer through the patterned hard mask 224. Consequently, a gate dielectric layer 220 and a gate layer 222 covering a portion of the patterned semiconductor layer 206 are formed on the semiconductor substrate 200. An extension direction of the gate dielectric layer 220 and the gate layer 222 is perpendicular to an extension direction of the patterned semiconductor layer 206 as shown in FIG. 5. And the gate dielectric layer 220 and the gate layer 222 cover a portion of a sidewall of the patterned semiconductor layer 206. The gate dielectric layer 220 includes the conventional dielectric material such as silicon oxide (SiO), silicon nitride (SiN), or silicon oxynitride (SiON). In the preferred embodiment, the gate dielectric layer 210 can further include high-K dielectric material such as hafnium oxide (HfO), hafnium silicate (HfSiO), or metal oxide or metal silicate exemplarily of aluminum (Al), zirconium (Zr), lanthanum (La), but not limited to this. In addition, when the gate dielectric layer 220 of the preferred embodiment adopts the high-K dielectric material, the present invention can be further integrated to the metal gate process. Therefore control gate compatible to the high-K gate dielectric layer is obtained. Accordingly, the gate layer 222 can include different materials according to the gate-first or gate-last process. For example, when the preferred embodiment is integrated to the gate-first process, the gate layer 222 includes metal such as tantalum (Ta), titanium (Ti), ruthenium (Ru), molybdenum (Mo), alloys of the aforementioned metals, metal nitride such as tantalum nitride (TaN), titanium nitride (TiN), molybdenum nitride (MoN), or metal carbide such as tantalum carbide (TaC). It is noteworthy that the metals are chosen by providing proper work function to the multi-gate transistors of different conductivity types. And the gate layer 222 can be a single-layered or multi-layered structure. When the preferred embodiment is integrated to the gate-last process, the gate layer 222 serves as a dummy gate and includes semiconductor material such as polysilicon.

After forming the gate dielectric layer 220 and the gate layer 222, a tilted implantation as required is performed to form a source/drain extension regions (not shown) in the patterned semiconductor layer 206. Subsequently, a spacer (not shown) is formed on sidewalls of the gate layer 222 and the gate dielectric layer 220. Additionally, the spacer can be a single-layered or multi-layered structure. After forming the spacer, a selective epitaxial growth (SEG) process is performed to form an epitaxial layer (not shown) on the patterned semiconductor layer 206. Furthermore, materials having lattice constant different from the patterned semiconductor layer 206 is introduced in the SEG process according to the requirement to conductivity types of the multi-gate transistor device. And dopants of a conductivity type can also be introduced before, after or simultaneously in the SEG process. Consequently, source/drain for a multi-gate transistor device and a multi-gate transistor device are simultaneously obtained. Since the elements such as the gate dielectric layer 220, the gate layer 222, the source/drain extension regions, the spacer and the epitaxial source/drain are well known to those skilled in the art, those details are omitted in the interest of brevity.

According to the method for manufacturing a multi-gate transistor device of the first preferred embodiment, the thermal treatment 210 is provided to rounding the sharp corners of the patterned semiconductor layer 206. By introducing hydrogen, smooth arc corners (as shown in Circle 206b) are easily obtained by the thermal treatment 210 under 740° C., which fulfills the lower thermal budget requirement to FinFET process. Consequently, corner leakage is prevented. Furthermore, the thermal treatment 210 provided by the preferred embodiment improves the surface roughness of the patterned semiconductor layer 206 and therefore improves the formation result of the gate dielectric layer 220 and the gate layer 222. Thus electric performance of the multi-gate transistor device is improved. In addition, because the thermal treatment 210 is able to rounding the corner of the patterned semiconductor layer 206 adjacent to the semiconductor substrate 200, a recess (as shown in Circle 206c) is formed and selectively followed by forming a pad oxide layer in the recess. The above mentioned approach is introduced to reduce the point leakage current.

Figure 6:
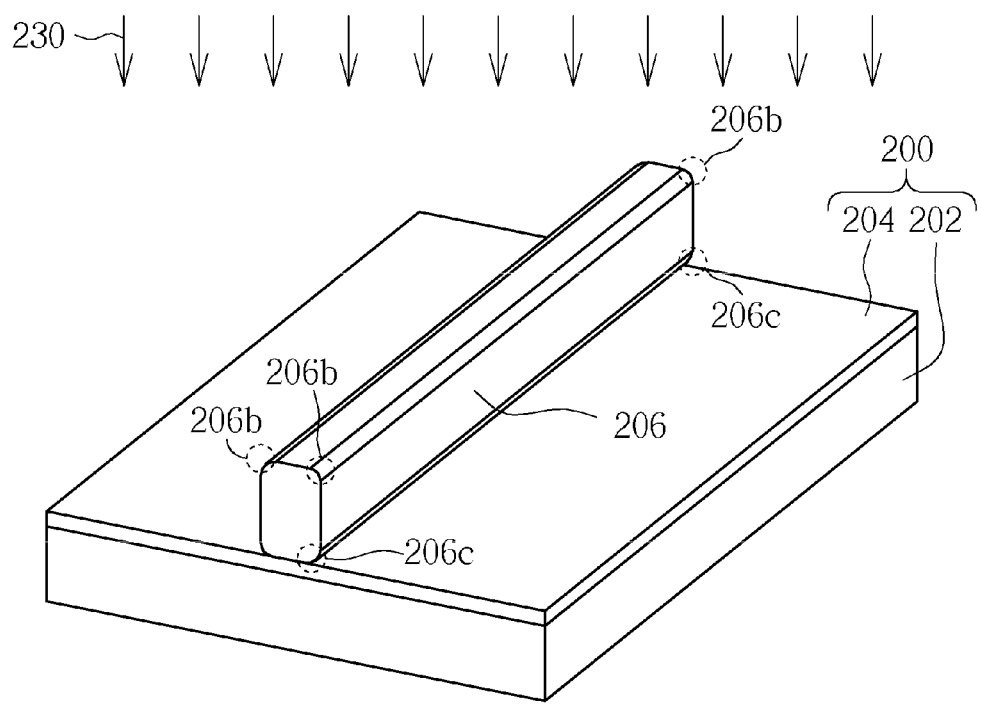
FIG. 6 is a schematic drawing illustrating a method for manufacturing a multi-gate transistor device provided by a second preferred embodiment of the present invention.

Please refer to FIG. 6, which is a schematic drawing illustrating a method for manufacturing a multi-gate transistor device provided by a second preferred embodiment of the present invention. Please note that elements the same in both first and second preferred embodiments are designated by the same numerals, thus the material choices and steps for forming those elements are all omitted in the interest of brevity. As shown in FIG. 6, the preferred embodiment first provides a semiconductor substrate 200 such as a SOI substrate upwardly including a silicon substrate 202, a BOX layer 204, and a semiconductor layer (not shown) such as a single crystalline silicon layer. However, the semiconductor substrate 200 provided by the preferred embodiment also can include a bulk silicon substrate.

As mentioned above, a patterned hard mask for defining at least a fin of a multi-gate transistor device is then formed on the semiconductor substrate 200 and followed by performing an etching process. Thus a portion of the semiconductor material of the semiconductor substrate 200 is removed to form at least a patterned semiconductor layer 206 on the semiconductor substrate 200. The patterned semiconductor layer 206 includes a width and a height, and a ratio between the width and the height is about 1:1.5-1:2, but not limited to this. After forming the patterned semiconductor layer 206, the patterned hard mask is removed to expose the patterned semiconductor layer 206. As mentioned above, the patterned semiconductor layer 206 is a slim structure having rectangular cross-section view. Therefore, the corners of the patterned semiconductor layer 206, which are emphasized by Circle 206a in FIG. 2, are all sharp corners. And thus corner leakage is always found at those sharp corners.

Please refer to FIG. 6. Next, a thermal treatment 230 is performed to rounding the patterned semiconductor layer 206. In detail, the thermal treatment 230 includes a step of introducing nitrogen and hydrogen chloride (HCl). A gas flow rate of nitrogen is between 20 slm and 40 slm, and a gas flow rate of HCl is between 20 standard cubic centimeter per minute (sccm) and 120 sccm. The thermal treatment 230 includes a process pressure, and the process pressure is lower than 10 Torr. The thermal treatment 230 also includes a process temperature lower than 800° C., preferably lower than 720° C. The thermal treatment 230 further includes a process duration and the process duration is less than 2 minutes. Because the corners atop the patterned semiconductor layer 206, even the corners adjacent to the BOX layer 204, have higher free energy, silicon material in the corners easily react with hydrogen and thus are removed from the patterned semiconductor layer 206. Furthermore, HCl introduced in the preferred embodiment even accelerates the reaction between silicon and hydrogen. Therefore, the thermal treatment 230 is able to rounding the patterned semiconductor layer 206 under an even lower thermal budget, under a lower process pressure and in a shorter process duration. As shown in FIG. 6, the patterned semiconductor layer 206 consequently obtains smooth arc corners as emphasized by Circle 206b and Circle 206c.

Subsequently, elements such as the gate dielectric layer 220, the gate layer 222, the source/drain extension regions, the spacer, and the epitaxial source/drain are sequentially formed as mentioned above, and those details are therefore omitted for simplicity.

According to the method for manufacturing a multi-gate transistor device of the second preferred embodiment, the thermal treatment 230 is provided to rounding the sharp corners of the patterned semiconductor layer 206. By introducing hydrogen and HCl, smooth arc corners (as shown in Circle 206b) are easily obtained by the thermal treatment 230 under 720° C., which fulfills the lower thermal budget requirement to FinFET process. Consequently, corner leakage is prevented. Furthermore, the thermal treatment 230 provided by the preferred embodiment improves the surface roughness of the patterned semiconductor layer 206 and therefore improves the formation result of the gate dielectric layer 220 and the gate layer 222. Thus electric performance of the multi-gate transistor device is improved. In addition, because the thermal treatment 230 is able to rounding the corners of the patterned semiconductor layer 206 adjacent to the semiconductor substrate 200, a recess (as shown in Circle 206c) is formed and selectively followed by forming a pad oxide layer in the recess. The above mentioned approach is introduced to reduce the point leakage current.

According to the method for manufacturing a multi-gate transistor device provided by the present invention, the corners of the patterned semiconductor layer are rounded by performing the thermal treatment with the process temperature lower than 800° C., even lower than 720° C., that fulfills the low thermal budget requirement of FinFET process. Consequently, corner leakage is prevented. In the same time, surface roughness of the patterned semiconductor layer is improved by the thermal treatment, and thus the formation result of the gate dielectric layer and the gate layer, which are formed on the patterned semiconductor layer, is improved. The thermal treatment even changes the lattice orientation of the patterned semiconductor layer. Accordingly the method for manufacturing multi-gate transistor device improves electric performance of the obtained multi-gate transistor device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for manufacturing multi-gate transistor device, comprising:
   providing a semiconductor substrate having a patterned semiconductor layer and a patterned hard mask sequentially formed thereon;
   removing the patterned hard mask;
   performing a thermal treatment to rounding the patterned semiconductor layer with a process temperature of the thermal treatment is lower than 800° C., the thermal treatment comprising introducing nitrogen and hydrogen chloride (HCl); and
   sequentially forming a gate dielectric layer and a gate layer covering a portion of the patterned semiconductor layer on the semiconductor substrate.

2. The method for manufacturing multi-gate transistor device according to claim 1, wherein the semiconductor substrate comprises a silicon-on-insulator (SOI) substrate or a bulk silicon substrate.

3. The method for manufacturing multi-gate transistor device according to claim 1, wherein the gate dielectric layer comprises a high dielectric constant (high-k) material.

4. The method for manufacturing multi-gate transistor device according to claim 1, wherein the thermal treatment comprises a step of introducing nitrogen.

5. The method for manufacturing multi-gate transistor device according to claim 4, wherein the thermal treatment comprises a process pressure and the process pressure is lower than 1 Torr.

6. The method for manufacturing multi-gate transistor device according to claim 4, wherein the process temperature of the thermal treatment is preferably lower than 740° C.

7. The method for manufacturing multi-gate transistor device according to claim 1, wherein the thermal treatment comprises a process pressure and the process pressure is lower than 10 Torr.

8. The method for manufacturing multi-gate transistor device according to claim 1, wherein the process temperature of the thermal treatment is lower than 720° C.

9. The method for manufacturing multi-gate transistor device according to claim 1, wherein a gas flow rate of nitrogen is between 20 standard liter per minute (slm) and 40 slm.

10. The method for manufacturing multi-gate transistor device according to claim 1, wherein a gas flow rate of HCl is between 20 standard cubic centimeter per minute (sccm) and 120 sccm.

11. The method for manufacturing multi-gate transistor device according to claim 1, wherein a process duration of the thermal treatment is less than 2 minutes.

* * * * *